(12) United States Patent
Jung

(10) Patent No.: US 9,299,542 B2
(45) Date of Patent: Mar. 29, 2016

(54) METHOD OF MONITORING A MANUFACTURING-PROCESS AND MANUFACTURING-PROCESS MONITORING DEVICE

(71) Applicant: SAMSUNG DISPLAY CO., LTD., Yongin, Gyeonggi-Do (KR)

(72) Inventor: Young-Jae Jung, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 272 days.

(21) Appl. No.: 14/016,047

(22) Filed: Aug. 31, 2013

(65) Prior Publication Data

US 2014/0209782 A1 Jul. 31, 2014

(30) Foreign Application Priority Data

Jan. 29, 2013 (KR) ........................ 10-2013-0009698

(51) Int. Cl.
*G01N 21/84* (2006.01)
*H01J 37/32* (2006.01)

(52) U.S. Cl.
CPC ....... *H01J 37/3299* (2013.01); *H01J 37/32972* (2013.01)

(58) Field of Classification Search
CPC .......... H05H 1/00; H05H 1/0006; H05H 1/24
USPC ............. 250/206, 221, 222.1; 216/60, 63, 67; 204/192.1, 192.26; 427/532, 535
See application file for complete search history.

(56) References Cited

U.S. PATENT DOCUMENTS

| 2007/0223641 | A1* | 9/2007 | Kondo | 376/150 |
| 2008/0278721 | A1* | 11/2008 | Bai et al. | 356/311 |
| 2011/0215072 | A1 | 9/2011 | Park et al. | |

FOREIGN PATENT DOCUMENTS

| KR | 10-2007-0048832 A | 5/2007 |
| KR | 10-2011-0101483 A | 9/2011 |
| KR | 10-2011-0133758 A | 12/2011 |

\* cited by examiner

*Primary Examiner* — Kevin Pyo
(74) *Attorney, Agent, or Firm* — Lee & Morse, P.C.

(57) ABSTRACT

A method of monitoring a manufacturing process includes generating a measurement data by analyzing emission intensity of plasma emission light using a measurement device, the plasma emission light being generated when a plasma gas of a manufacturing process device is changed from an energy level corresponding to a high energy state to an energy level corresponding to a low energy state, generating a compensated value based on the measurement data, the compensated value being generated by offsetting a sensitivity change that is caused due to pollution of the manufacturing process device and the measurement device or measurement locations of the measurement device, and monitoring the manufacturing process based on the compensated value.

10 Claims, 6 Drawing Sheets

METHOD OF MONITORING A MANUFACTURING-PROCESS AND MANUFACTURING-PROCESS MONITORING DEVICE

CROSS-REFERENCE TO RELATED APPLICATION(S)

This application claims priority under 35 USC §119 to Korean Patent Applications No. 10-2013-0009698, filed on Jan. 29, 2013 in the Korean Intellectual Property Office (KIPO), the contents of which are incorporated herein in its entirety by reference.

BACKGROUND

1. Field

Embodiments relate to a method of monitoring a manufacturing process and a manufacturing process monitoring device.

2. Description of the Related Art

Generally, a plasma etching process may be used for eliminating specific materials that are patterned on a silicon substrate in a manufacturing process of a semiconductor and/or a device having the semiconductor (e.g., a display device).

SUMMARY

According to some example embodiments, a method of monitoring a manufacturing process may include a step of generating a measurement data by analyzing emission intensity of plasma emission light using a measurement device, the plasma emission light being generated when a plasma gas of a manufacturing process device is changed from an energy level corresponding to a high energy state to an energy level corresponding to a low energy state, a step of generating a compensated value based on the measurement data, the compensated value being generated by offsetting a sensitivity change that is caused due to pollution of the manufacturing process device and the measurement device or measurement locations of the measurement device, and a step of monitoring the manufacturing process based on the compensated value.

In example embodiments, the step of generating the compensated value may include a step of generating the compensated value based on an average and a standard deviation of the measurement data.

In example embodiments, the step of generating the compensated value may include a step of determining the compensated value as a normalized value that is generated by normalizing the emission intensity of the plasma emission light based on an average and a standard deviation of the emission intensity of the plasma emission light in reference to a preset band of wavelengths.

In example embodiments, the step of generating the compensated value may include a step of determining the compensated value as a normalized value that is generated by normalizing the emission intensity of the plasma emission light based on an average and a standard deviation of the emission intensity of the plasma emission light in reference to a whole band of wavelengths.

In example embodiments, the step of monitoring the manufacturing process may include a step of performing an endpoint detection operation based on the compensated value.

In example embodiments, the step of monitoring the manufacturing process may include a step of performing a leakage detection operation on the manufacturing process device based on the compensated value.

According to some example embodiments, a method of monitoring a manufacturing process may include a step of generating a plasma gas by injecting a gas of a manufacturing process device into a generating device that converts the gas into the plasma gas, a step of generating a measurement data by analyzing emission intensity of plasma emission light using a measurement device, the plasma emission light being generated when the plasma gas is changed from an energy level corresponding to a high energy state to an energy level corresponding to a low energy state, a step of generating a compensated value based on the measurement data, the compensated value being generated by offsetting a sensitivity change that is caused due to pollution of the manufacturing process device and the measurement device or measurement locations of the measurement device, and a step of monitoring the manufacturing process based on the compensated value.

In example embodiments, the step of generating the compensated value may include a step of generating the compensated value based on an average and a standard deviation of the measurement data.

In example embodiments, the step of generating the compensated value may include a step of determining the compensated value as a normalized value that is generated by normalizing the emission intensity of the plasma emission light based on an average and a standard deviation of the emission intensity of the plasma emission light in reference to a preset band of wavelengths.

In example embodiments, the step of generating the compensated value may include a step of determining the compensated value as a normalized value that is generated by normalizing the emission intensity of the plasma emission light based on an average and a standard deviation of the emission intensity of the plasma emission light in reference to a whole band of wavelengths.

In example embodiments, the step of monitoring the manufacturing process may include a step of performing an endpoint detection operation based on the compensated value.

In example embodiments, the step of monitoring the manufacturing process may include a step of performing a leakage detection operation on the manufacturing process device based on the compensated value.

According to some example embodiments, a manufacturing process monitoring device may include a measurement unit that generates a measurement data by analyzing emission intensity of plasma emission light, the plasma emission light being generated when a plasma gas of a manufacturing process device is changed from an energy level corresponding to a high energy state to an energy level corresponding to a low energy state, and a control unit that generates a compensated value based on the measurement data, the compensated value being generated by offsetting a sensitivity change that is caused due to pollution of the manufacturing process device and the measurement unit or measurement locations of the measurement unit, and that monitors the manufacturing process based on the compensated value.

In example embodiments, the manufacturing process monitoring device may further include an output unit that displays a monitoring result output from the control unit.

In example embodiments, the control unit may determine the compensated value as a normalized value that is generated by normalizing the emission intensity of the plasma emission light based on an average and a standard deviation of the emission intensity of the plasma emission light in reference to a preset band of wavelengths.

In example embodiments, the control unit may determine the compensated value as a normalized value that is generated by normalizing the emission intensity of the plasma emission light based on an average and a standard deviation of the emission intensity of the plasma emission light in reference to a whole band of wavelengths.

According to some example embodiments, a manufacturing process monitoring device may include a generating unit that receives a gas of a manufacturing process device, and that generates a plasma gas based on the gas of the manufacturing process device, a measurement unit that generates a measurement data by analyzing emission intensity of plasma emission light, the plasma emission light being generated when the plasma gas of the generating unit is changed from an energy level corresponding to a high energy state to an energy level corresponding to a low energy state, and a control unit that generates a compensated value based on the measurement data, the compensated value being generated by offsetting a sensitivity change that is caused due to pollution of the manufacturing process device and the measurement unit or measurement locations of the measurement unit, and that monitors the manufacturing process based on the compensated value.

In example embodiments, the manufacturing process monitoring device may further include an output unit that displays a monitoring result output from the control unit.

In example embodiments, the control unit may determine the compensated value as a normalized value that is generated by normalizing the emission intensity of the plasma emission light based on an average and a standard deviation of the emission intensity of the plasma emission light in reference to a preset band of wavelengths.

In example embodiments, the control unit may determine the compensated value as a normalized value that is generated by normalizing the emission intensity of the plasma emission light based on an average and a standard deviation of the emission intensity of the plasma emission light in reference to a whole band of wavelengths.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
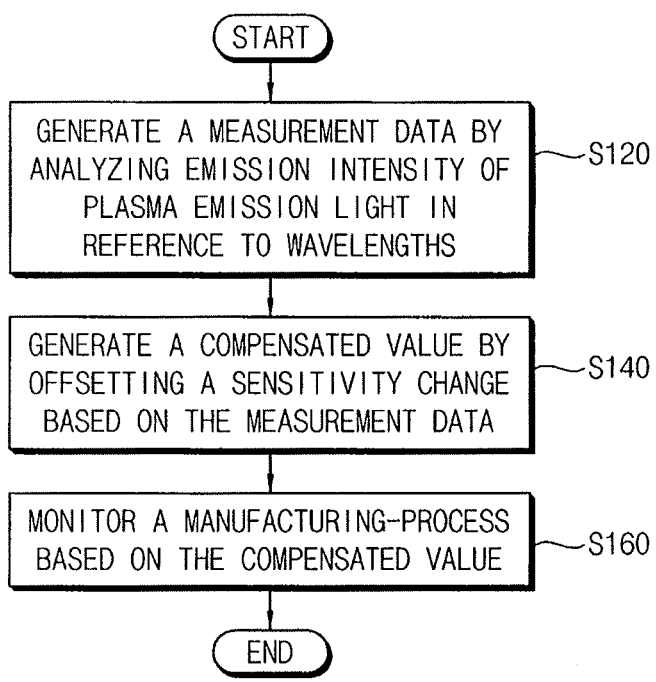
FIG. 1 is a flow chart illustrating a method of monitoring a manufacturing process according to example embodiments.

Various example embodiments will be described more fully hereinafter with reference to the accompanying drawings, in which some example embodiments are shown. Embodiments may, however, be embodied in many different forms and should not be construed as limited to the example embodiments set forth herein. Rather, these example embodiments are provided so that this disclosure will be thorough and complete, and will fully convey the scope of embodiments to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In particular, the terminology "normalization" used herein indicates a generation of specific data (e.g., convenient data to be used for specific purposes) by transforming data according to specific rules. For example, the terminology "normalization" used in statistics may indicate a generation of a specific variable (i.e., within a predetermined range) by transforming a variable according to a specific equation expression (i.e., $Z(t)=[I(t)-X(t)]/\sigma(t)$). Here, $Z(t)$ denotes a normalized value, $I(t)$ denotes a variable to be normalized (e.g., emission intensity), $X(t)$ denotes an average of the variable to be normalized, and $\sigma(t)$ denotes a standard deviation of the variable to be normalized. As described above, the terminology "normalization" used herein may correspond to the terminology "normalization" used in statistics. However, the terminology "normalization" used herein is not limited to the terminology "normalization" used in statistics. For example, the terminology "normalization" used herein may include a concept of offsetting a change of a variable, where the variable is gradually changed due to external environmental factors in a specific direction for a long time.

Hereinafter, with reference to FIGS. 1 through 6B, example embodiments will be described in detail.

FIG. 1 is a flow chart illustrating a method of monitoring a manufacturing process according to example embodiments.

Referring to FIG. 1, a case in which plasma is used in a manufacturing process device is illustrated. The method of FIG. 1 may generate a measurement data by analyzing emission intensity of plasma emission light in reference to wavelengths using a measurement device (or, measurement unit) (operation S120). The plasma emission light may be generated (i.e., emitted) when a plasma gas of the manufacturing process device is changed from an energy level corresponding to a high energy state to an energy level corresponding to a low energy state. Subsequently, the method of FIG. 1 may generate a compensated value based on the measurement data (operation S140). The compensated value may be generated by offsetting a sensitivity change that is caused due to pollution of the manufacturing process device and the measurement device and/or measurement locations of the measurement device. Next, the method of FIG. 1 may monitor the manufacturing process based on the compensated value (operation S160).

The compensated value may be generated based on an average and a standard deviation of the measurement data. For example, the compensated value may be determined as a normalized value generated by normalizing the measurement data based on the average and the standard deviation of the measurement data. In example embodiments, the terminology "normalization" used herein may indicate a generation of a specific variable (i.e., within a predetermined range) by transforming a variable according to a specific equation expression (i.e., $Z(t)=[I(t)-X(t)]/\sigma(t)$). Here, $Z(t)$ denotes the normalized value, $I(t)$ denotes a variable to be normalized (e.g., emission intensity), $X(t)$ denotes an average of the variable to be normalized, and $\sigma(t)$ denotes a standard deviation of the variable to be normalized.

In an example embodiment, the compensated value may be determined as the normalized value (i.e., $Z(t)$) generated by normalizing the emission intensity of the plasma emission light in reference to a specific band of wavelengths. In this case, the equation expression (i.e., $Z(t)=[I(t)-X(t)]/\sigma(t)$) may be used, where the equation expression includes the average and the standard deviation of the emission intensity. Here, $I(t)$ denotes the emission intensity of the plasma emission light in reference to a specific band or set of wavelengths. In another example embodiment, the compensated value may be determined to be the normalized value (i.e., $Z(t)$) generated by normalizing the emission intensity of the plasma emission light in reference to a whole band of wavelengths. In this case, the equation expression (i.e., $Z(t)=[I(t)-X(t)]/\sigma(t)$) may be used, where the equation expression includes the average and the standard deviation of the emission intensity. Here, $I(t)$ denotes the emission intensity of the plasma emission light in reference to a whole band of wavelengths.

A monitoring of the manufacturing process device may be performed by performing an endpoint detection operation based on the compensated value. The endpoint indicates the time when a specific etching process is completed or the time when an etching front-side reaches an etching stop layer in the specific etching process. Thus, an over-etching or an under-etching may occur when the endpoint is inaccurately detected. Therefore, the method of FIG. 1 may help prevent occurrences of the over-etching and/or the under-etching by detecting the endpoint based on whether or not the emission intensity due to a specific gas of the manufacturing process device is out of a predetermined tolerance range. For example, the method of FIG. 1 may detect the endpoint when the emission intensity due to the specific gas of the manufacturing process device is out of the predetermined tolerance range.

In an example embodiment, a monitoring of the manufacturing process device may be performed by performing a leakage detection operation on the manufacturing process device based on the compensated value. When a leakage occurs in the manufacturing process device, interference of an unintentional external gas may occur in the manufacturing process device, or concentration change of an internal gas may occur in the manufacturing process device. Therefore, the method of FIG. 1 may help prevent occurrences of the interference of the unintentional external gas and/or the concentration change of the internal gas by detecting the leakage of the manufacturing process device based on whether or not the emission intensity due to a specific gas or a gas constituting the atmosphere in the manufacturing process device is out of a predetermined tolerance range. For example, the method of FIG. 1 may detect the leakage occurrence when the emission intensity due to the specific gas or the gas constituting the atmosphere in the manufacturing process device is out of the predetermined tolerance range.

Figure 2:
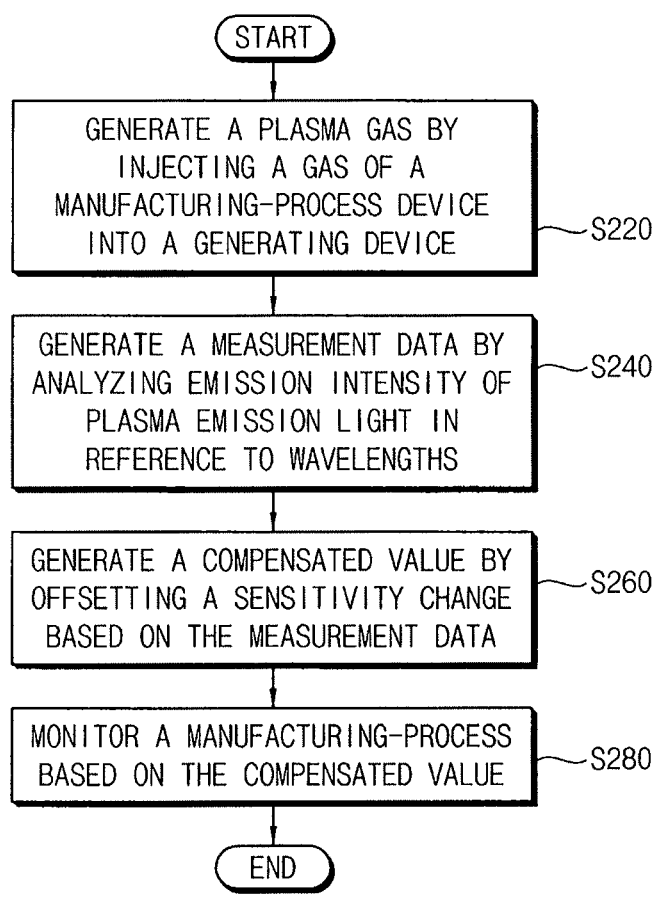
FIG. 2 is a flow chart illustrating a method of monitoring a manufacturing process according to example embodiments.

FIG. 2 is a flow chart illustrating a method of monitoring a manufacturing process according to example embodiments.

Referring to FIG. 2, a case in which plasma is not used in a manufacturing process device is illustrated. The method of FIG. 2 may generate a plasma gas by injecting a gas of the manufacturing process device into a generating device (or, generating unit) (operation S220). The generating device may convert the gas into the plasma gas. As will be apparent to one of ordinary skill in the art from the description and drawings, the plasma may not be used in the manufacturing process device, but a gas of the manufacturing process device may be conveyed to the generating device, which may convert the gas into the plasma gas for monitoring the manufacturing process. Subsequently, the method of FIG. 2 may generate a measurement data by analyzing emission intensity of plasma emission light in reference to wavelengths using a measurement device (or, measurement unit) (operation S240). The plasma emission light may be generated (i.e., emitted) when the plasma gas is changed from an energy level corresponding to a high energy state to an energy level corresponding to a low energy state. Next, the method of FIG. 2 may generate a compensated value based on the measurement data (operation S260). The compensated value may be generated by offsetting a sensitivity change that is caused due to pollution of the manufacturing process device and the measurement device and/or measurement locations of the measurement device. Finally, the method of FIG. 2 may monitor the manufacturing process based on the compensated value (operation S280).

The generating device may receive the gas of the manufacturing process device, and may generate the plasma gas by converting the received gas into the plasma gas. The generating device may be attached to an emission line in order not to influence on the manufacturing process. Thus, the generating device may receive an emission gas of the emission line as the gas of the manufacturing process device.

The compensated value may be generated based on an average and a standard deviation of the measurement data. For example, the compensated value may be determined as a normalized value generated by normalizing the measurement data based on the average and the standard deviation of the measurement data. In example embodiments, the terminology "normalization" used herein may indicate a generation of a specific variable (i.e., within a predetermined range) by transforming a variable according to a specific equation expression (i.e., $Z(t)=[I(t)-X(t)]/\sigma(t)$). Here, Z(t) denotes the normalized value, I(t) denotes a variable to be normalized (e.g., emission intensity), X(t) denotes an average of the variable to be normalized, and $\sigma(t)$ denotes a standard deviation of the variable to be normalized.

In an example embodiment, the compensated value may be determined to be the normalized value (i.e., Z(t)) generated by normalizing the emission intensity of the plasma emission light in reference to a specific band of wavelengths. In this case, the equation expression (i.e., $Z(t)=[I(t)-X(t)]/\sigma(t)$) may be used, where the equation expression includes the average and the standard deviation of the emission intensity. Here, I(t) denotes the emission intensity of the plasma emission light in reference to a specific band of wavelengths. In another example embodiment, the compensated value may be determined to be the normalized value (i.e., Z(t)) generated by normalizing the emission intensity of the plasma emission light in reference to a whole band of wavelengths. In this case, the equation expression (i.e., $Z(t)=[I(t)-X(t)]/\sigma(t)$) may be used, where the equation expression includes the average and the standard deviation of the emission intensity. Here, I(t) denotes the emission intensity of the plasma emission light in reference to a whole band of wavelengths.

A monitoring of the manufacturing process device may be performed by performing an endpoint detection operation based on the compensated value. The endpoint indicates the time when a specific etching process is completed or the time when an etching front-side reaches an etching stop layer in the specific etching process. Thus, an over-etching or an under-etching may occur when the endpoint is inaccurately detected. Therefore, the method of FIG. 2 may help prevent occurrences of the over-etching and/or the under-etching by detecting the endpoint based on whether or not the emission intensity due to a specific gas of the manufacturing process device is out of a predetermined tolerance range. For example, the method of FIG. 2 may detect the endpoint when the emission intensity due to the specific gas of the manufacturing process device is out of the predetermined tolerance range.

A monitoring of the manufacturing process device may be performed by performing a leakage detection operation on the manufacturing process device based on the compensated value. When a leakage occurs in the manufacturing process device, interference of an unintentional external gas may occur in the manufacturing process device, or concentration change of an internal gas may occur in the manufacturing process device. Therefore, the method of FIG. 2 may help prevent occurrences of the interference of the unintentional external gas and/or the concentration change of the internal gas by detecting the leakage of the manufacturing process device based on whether or not the emission intensity due to a specific gas or a gas constituting the atmosphere in the manufacturing process device is out of a predetermined tolerance range. For example, the method of FIG. 2 may detect the leakage occurrence when the emission intensity due to the specific gas or the gas constituting the atmosphere in the manufacturing process device is out of the predetermined tolerance range.

Figure 3:
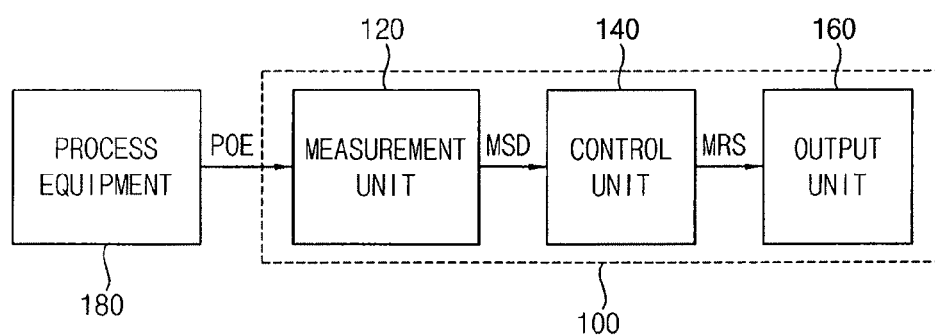
FIG. 3 is a block diagram illustrating a manufacturing process monitoring device according to example embodiments.

FIG. 3 is a block diagram illustrating a manufacturing process monitoring device according to example embodiments.

Referring to FIG. 3, a case in which plasma is used in the manufacturing process device (or, process equipment) 180 is illustrated. In addition, the manufacturing process device 180 may be monitored by the manufacturing process monitoring device 100. To this end, the manufacturing process monitoring device 100 may include a measurement unit 120 and a control unit 140. In some example embodiments, the manufacturing process monitoring device 100 may further include an output unit 160.

The measurement unit 120 may receive a plasma emission light POE from the manufacturing process device 180, where the plasma emission light POE is generated (i.e., emitted) when a plasma gas of the manufacturing process device 180 is changed from an energy level corresponding to a high energy state to an energy level corresponding to a low energy state. In addition, the measurement unit 120 may generate a measurement data MSD by analyzing emission intensity of the plasma emission light POE in reference to wavelengths, and then may output the measurement data MSD to the control unit 140. For example, the measurement unit 120 may be an optical emission spectrometer (OES). In some example embodiments, the manufacturing process monitoring device 100 may include components such as a view port, an optical fiber cable, etc. that guide the plasma emission light POE to the measurement unit 120 (e.g., the optical emission spectrometer).

The control unit 140 may receive the measurement data MSD from the measurement unit 120, may generate a compensated value based on the measurement data MSD, and may monitor the manufacturing process based on the compensated value. The compensated value may be generated by offsetting a sensitivity change that is caused due to pollution of the manufacturing process device 180 and the measurement unit 120 and/or measurement locations of the measurement unit 120. In some example embodiments, the control unit 140 may output a monitoring result MRS to the output unit 160 that displays the monitoring result MRS for users.

The compensated value may be generated based on an average and a standard deviation of the measurement data MSD. For example, the compensated value may be determined as a normalized value generated by normalizing the measurement data MSD based on the average and the standard deviation of the measurement data MSD. In example embodiments, the terminology "normalization" used herein may indicate a generation of a specific variable (i.e., within a predetermined range) by transforming a variable according to a specific equation expression (i.e., $Z(t)=[I(t)-X(t)]/\sigma(t)$). Here, Z(t) denotes the normalized value, I(t) denotes a variable to be normalized (e.g., emission intensity), X(t) denotes an average of the variable to be normalized, and $\sigma(t)$ denotes a standard deviation of the variable to be normalized.

In an example embodiment, the control unit 140 may determine the compensated value to be the normalized value (i.e., Z(t)) generated by normalizing the emission intensity of the plasma emission light POE in reference to a specific band of wavelengths. In this case, the equation expression (i.e., $Z(t)=[I(t)-X(t)]/\sigma(t)$) may be used, where the equation expression includes the average and the standard deviation of the emission intensity. Here, I(t) denotes the emission intensity of the plasma emission light POE in reference to a specific band of wavelengths. In another example embodiment, the control unit 140 may determine the compensated value to be the normalized value (i.e., Z(t)) generated by normalizing the emission intensity of the plasma emission light POE in reference to a whole band of wavelengths. In this case, the equation expression (i.e., $Z(t)=[I(t)-X(t)]/\sigma(t)$) may be used, where the equation expression includes the average and the standard deviation of the emission intensity. Here, I(t) denotes the emission intensity of the plasma emission light POE in reference to a whole band of wavelengths.

The control unit 140 may perform a monitoring of the manufacturing process device 180 by performing an endpoint detection operation based on the compensated value. The endpoint indicates the time when a specific etching process is completed or the time when an etching front-side reaches an etching stop layer in the specific etching process. Thus, an over-etching or an under-etching may occur when the endpoint is inaccurately detected. Therefore, the manufacturing process monitoring device 100 may help prevent occurrences of the over-etching and/or the under-etching by detecting the endpoint based on whether or not the emission intensity due to a specific gas of the manufacturing process device 180 is out of a predetermined tolerance range. For example, the manufacturing process monitoring device 100 may detect the endpoint when the emission intensity due to the specific gas of the manufacturing process device 180 is out of the predetermined tolerance range.

The control unit 140 may perform a monitoring of the manufacturing process device 180 by performing a leakage detection operation on the manufacturing process device 180 based on the compensated value. When a leakage occurs in the manufacturing process device 180, interference of an unintentional external gas may occur in the manufacturing process device 180, or a concentration change of an internal gas may occur in the manufacturing process device 180. Therefore, the manufacturing process monitoring device 100 may help prevent occurrences of the interference of the unintentional external gas and/or the concentration change of the internal gas by detecting the leakage of the manufacturing process device 180 based on whether or not the emission intensity due to a specific external gas or a gas constituting the atmosphere in the manufacturing process device 180 is out of a predetermined tolerance range. For example, the manufacturing process monitoring device 100 may detect the leakage occurrence when the emission intensity due to the specific gas or the gas constituting the atmosphere in the manufacturing process device 180 is out of the predetermined tolerance range.

The output unit 160 may receive the monitoring result MRS from the control unit 140, and may display the monitoring result MRS for users. The output unit 180 may include devices such as a speaker, a printer, a monitor, etc. In some example embodiments, the output unit 180 may include a memory device and/or a storage device for storing data. For example, the memory device may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc. The storage device may be a solid state drive (SSD) device, a hard disk drive (HDD) device, a CD-ROM device, etc.

Figure 4:
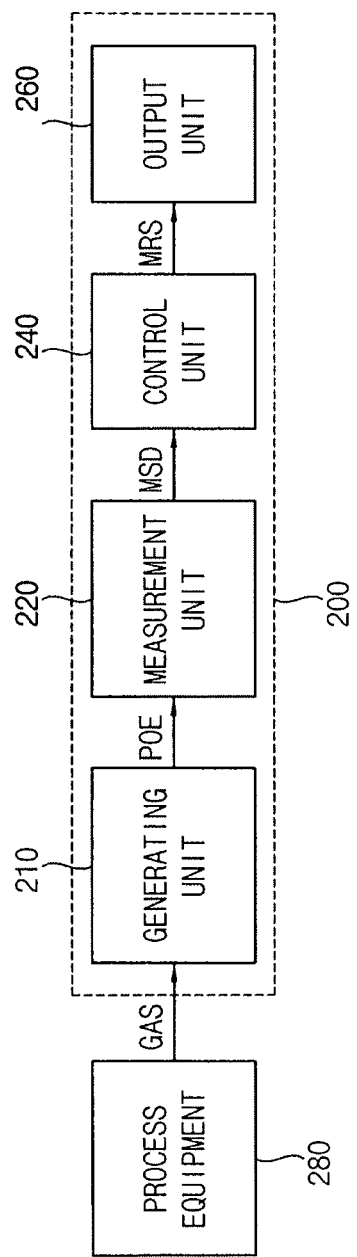
FIG. 4 is a block diagram illustrating a manufacturing process monitoring device according to example embodiments.

FIG. 4 is a block diagram illustrating a manufacturing process monitoring device according to example embodiments.

Referring to FIG. 4, a case in which plasma is not used in the manufacturing process device (or, process equipment) 280 is illustrated. In addition, the manufacturing process device 280 may be monitored by the manufacturing process monitoring device 200. To this end, the manufacturing process monitoring device 200 may include a generating unit 210, a measurement unit 220, and a control unit 240. In some example embodiments, the manufacturing process monitoring device 200 may further include an output unit 260.

The generating unit 210 may receive a gas GAS of the manufacturing process device 280, and may generate a plasma gas by converting the received gas GAS into the plasma gas. In some example embodiments, the plasma gas may be generated by performing a high-frequency induction heating operation on the gas GAS, or by performing a laser illuminating operation on the gas GAS. The generating unit 210 may be attached to an emission or exhaust line in order not to influence on the manufacturing process. Thus, the generating unit 210 may receive an emission gas of the emission line as the gas GAS of the manufacturing process device 280.

The measurement unit 220 may receive a plasma emission light POE from the generating unit 210, where the plasma emission light POE is generated (i.e., emitted) when the plasma gas of the generating unit 210 is changed from an energy level corresponding to a high energy state to an energy level corresponding to a low energy state. In addition, the measurement unit 220 may generate a measurement data MSD by analyzing emission intensity of the plasma emission light POE in reference to wavelengths, and then may output the measurement data MSD to the control unit 240. For example, the measurement unit 220 may be an optical emission spectrometer (OES). In some example embodiments, the manufacturing process monitoring device 200 may include components such as a view port, an optical fiber cable, etc. that guide the plasma emission light POE to the measurement unit 220 (e.g., the optical emission spectrometer).

The control unit 240 may receive the measurement data MSD from the measurement unit 220, may generate a compensated value based on the measurement data MSD, and may monitor the manufacturing process based on the compensated value. The compensated value may be generated by offsetting a sensitivity change that is caused due to pollution of the manufacturing process device 280 and the measurement unit 220 and/or measurement locations of the measurement unit 220. In some example embodiments, the control unit 240 may output a monitoring result MRS to the output unit 260 that displays the monitoring result MRS for users.

The compensated value may be generated based on an average and a standard deviation of the measurement data MSD. For example, the compensated value may be determined as a normalized value generated by normalizing the measurement data MSD based on the average and the standard deviation of the measurement data MSD. In example embodiments, the terminology "normalization" used herein may indicate a generation of a specific variable (i.e., within a predetermined range) by transforming a variable according to a specific equation expression (i.e., $Z(t)=[I(t)-X(t)]/\sigma(t)$). Here, $Z(t)$ denotes the normalized value, $I(t)$ denotes a variable to be normalized (e.g., emission intensity), $X(t)$ denotes an average of the variable to be normalized, and $\sigma(t)$ denotes a standard deviation of the variable to be normalized.

In an example embodiment, the control unit 240 may determine the compensated value to be the normalized value (i.e., $Z(t)$) generated by normalizing the emission intensity of the plasma emission light POE in reference to a specific band or set of wavelengths. In this case, the equation expression (i.e., $Z(t)=[I(t)-X(t)]/\sigma(t)$) may be used, where the equation expression includes the average and the standard deviation of the emission intensity. Here, $I(t)$ denotes the emission intensity of the plasma emission light POE in reference to a specific band of wavelengths. In another example embodiment, the control unit 240 may determine the compensated value to be the normalized value (i.e., $Z(t)$) generated by normalizing the emission intensity of the plasma emission light POE in reference to a whole band of wavelengths. In this case, the equation expression (i.e., $Z(t)=[I(t)-X(t)]/\sigma(t)$) may be used, where the equation expression includes the average and the standard deviation of the emission intensity. Here, $I(t)$ denotes the emission intensity of the plasma emission light POE in reference to a whole band of wavelengths.

The control unit 240 may perform a monitoring of the manufacturing process device 280 by performing an endpoint detection operation based on the compensated value. The endpoint indicates the time when a specific etching process is completed or the time when an etching front-side reaches an etching stop layer in the specific etching process. Thus, an over-etching or an under-etching may occur when the endpoint is inaccurately detected. Therefore, the manufacturing process monitoring device 200 may help prevent occurrences of the over-etching and/or the under-etching by detecting the endpoint based on whether or not the emission intensity due to a specific gas of the manufacturing process device 280 is out of a predetermined tolerance range. For example, the manufacturing process monitoring device 200 may detect the endpoint when the emission intensity due to the specific gas of the manufacturing process device 280 is out of the predetermined tolerance range.

The control unit 240 may perform a monitoring of the manufacturing process device 280 by performing a leakage detection operation on the manufacturing process device 280 based on the compensated value. When a leakage occurs in the manufacturing process device 280, interference of an unintentional external gas may occur in the manufacturing process device 180, or concentration change of an internal gas may occur in the manufacturing process device 280. Therefore, the manufacturing process monitoring device 200 may help prevent occurrences of the interference of the unintentional external gas and/or the concentration change of the internal gas by detecting the leakage of the manufacturing process device 280 based on whether or not the emission intensity due to a specific gas or a gas constituting the atmosphere in the manufacturing process device 280 is out of a predetermined tolerance range. For example, the manufacturing process monitoring device 200 may detect the leakage occurrence when the emission intensity due to the specific gas or the gas constituting the atmosphere in the manufacturing process device 280 is out of the predetermined tolerance range.

Figure 5A:
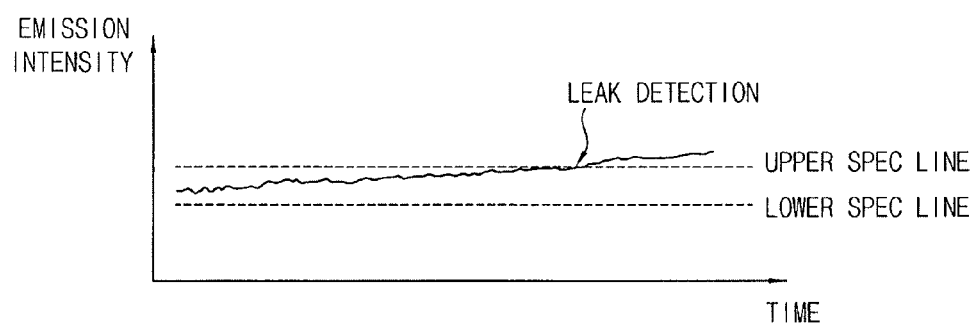
FIGS. 5A and 5B are diagrams illustrating an effect that wrong leakage detection is prevented by a method of monitoring a manufacturing process according to example embodiments.
Figure 5B:
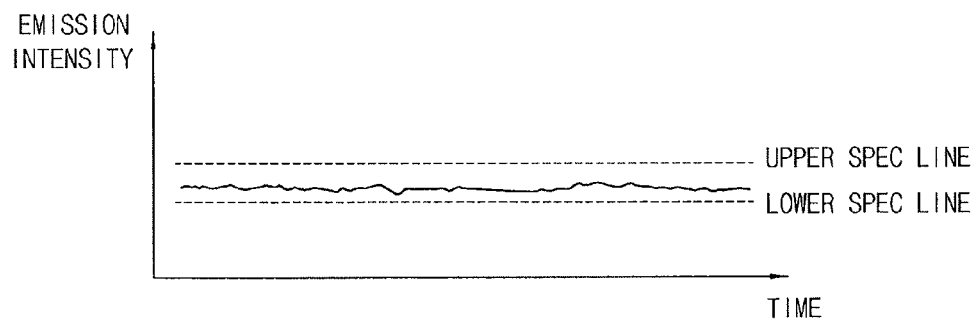

FIGS. 5A and 5B are diagrams illustrating an effect that wrong leakage detection is prevented by a method of monitoring a manufacturing process according to example embodiments.

Referring to FIGS. 5A and 5B, a leakage detection result that is generated by a comparative method of monitoring a manufacturing process and a leakage detection result that is generated by a method of monitoring a manufacturing process according to example embodiments are illustrated. FIGS. 5A and 5B show a case in which plasma is not used in a manufacturing process device. Here, an X-axis indicates a time, and a Y-axis indicates emission intensity of plasma emission light generated from a gas constituting the process atmosphere. In addition, a first dotted-line UPPER SPEC LINE indicates an upper limit line of a predetermined tolerance range, and a second dotted-line LOWER SPEC LINE indicates a lower limit line of the predetermined tolerance range. That is, the predetermined tolerance range is a kind of criteria for detecting a leakage occurrence.

As illustrated in FIG. 5A, when a monitoring of the manufacturing process device is performed based on a non-normalized value, the non-normalized emission intensity of the plasma emission light may be greater than the upper limit line UPPER SPEC LINE due to a variable change while no leakage actually occurs in the manufacturing process device. As described above, the variable may be gradually changed due to external environmental factors (e.g., such as pollution of the manufacturing process device) in a specific direction for a long time. As a result, a wrong leakage detection may occur (i.e., it may be determined that a leakage occurs in the manufacturing process device) while no leakage actually occurs in the manufacturing process device.

On the other hand, as illustrated in FIG. 5B, when a monitoring of the manufacturing process device is performed based on a normalized value, the normalized emission intensity of the plasma emission light may be maintained between the upper limit line UPPER SPEC LINE and the lower limit line LOWER SPEC LINE when no leakage actually occurs in the manufacturing process device. That is, the method of monitoring the manufacturing process according to example embodiments may offset the variable change to prevent an occurrence of the wrong leakage detection.

Figure 6A:
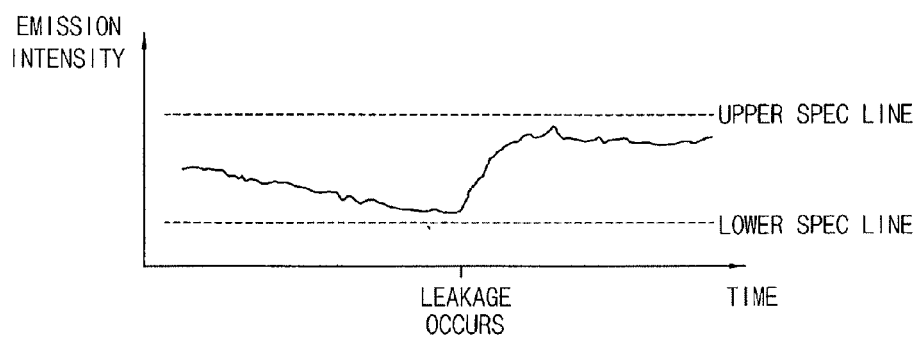
FIGS. 6A and 6B are diagrams illustrating an effect that leakage detection failure is prevented by a method of monitoring a manufacturing process according to example embodiments.
Figure 6B:
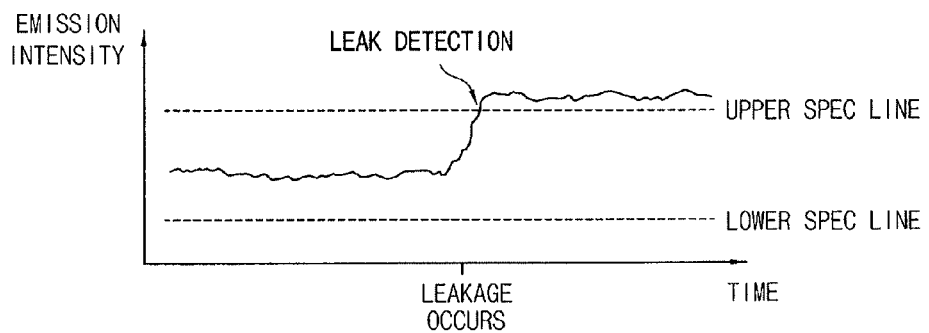

FIGS. 6A and 6B are diagrams illustrating an effect that leakage detection failure is prevented by a method of monitoring a manufacturing process according to example embodiments.

Referring to FIGS. 6A and 6B, a leakage detection result that is generated by a comparative method of monitoring a manufacturing process and a leakage detection result that is generated by a method of monitoring a manufacturing process according to example embodiments are illustrated. FIGS. 6A and 6B show a case in which plasma is used in a manufacturing process device. Here, an X-axis indicates a time, and a Y-axis indicates emission intensity of plasma emission light generated from a gas constituting the atmosphere. In addition, a first dotted-line UPPER SPEC LINE indicates an upper limit line of a predetermined tolerance range, and a second dotted-line LOWER SPEC LINE indicates a lower limit line of the predetermined tolerance range. That is, the predetermined tolerance range is a kind of criteria for detecting a leakage occurrence.

As illustrated in FIG. 6A, when a monitoring of the manufacturing process device is performed based on a non-normalized value, the non-normalized emission intensity of the plasma emission light may not be greater than the upper limit line UPPER SPEC LINE due to a variable change while a leakage actually occurs in the manufacturing process device. As described above, the variable may be gradually changed due to external environmental factors (e.g., such as pollution of the manufacturing process device) in a specific direction for a long time. As a result, a leakage detection failure may occur (i.e., it may be determined that no leakage occurs in the manufacturing process device) while a leakage actually occurs in the manufacturing process device.

On the other hand, as illustrated in FIG. 6B, when a monitoring of the manufacturing process device is performed based on a normalized value, the normalized emission intensity of the plasma emission light may be greater than the upper limit line UPPER SPEC LINE when a leakage actually occurs in the manufacturing process device. That is, the method of monitoring the manufacturing process according to example embodiments may offset the variable change to prevent an occurrence of the leakage detection failure.

In addition, since the normalized value has the same meaning for a long time, the normalized value may be used as a management parameter. Further, the normalized value may enable a direct comparison between difference equipments. Thus, the normalized value may allow an identical tolerance range (i.e., the upper limit line UPPER SPEC LINE and the lower limit line LOWER SPEC LINE) to be set for different equipments.

Embodiments may be applied to a manufacturing process of a semiconductor and/or a device having the semiconductor. For example, embodiments may be applied to a manufacturing process of a semiconductor included in a television, a computer monitor, a laptop, a digital camera, a cellular phone, a smart phone, a smart pad, a personal digital assistant (PDA), a portable multimedia player (PMP), an MP3 player, a video phone, a game console, a navigation system, etc.

As described above, embodiments relate generally to a manufacturing process technique. Embodiments may be applied to a method of monitoring a manufacturing process of a semiconductor and/or a device having the semiconductor, and a manufacturing process monitoring device employing the method.

By way of summation and review, it may be important for a plasma etching process to maintain an optimum condition because the specific materials have a small size and the plasma etching process is complicated. Thus, a real-time monitoring and a real-time process control may be used in the manufacturing process. An endpoint detection operation may be performed as an example of the real-time monitoring. The endpoint indicates the time when a specific etching process is completed or the time when an etching front-side reaches an etching stop layer in the specific etching process. In the manufacturing process, the etching process may be inaccurately completed if the endpoint detection operation is improperly performed. Thus, a low-quality product (e.g., the semiconductor and/or the device having the semiconductor) may be manufactured when the endpoint detection operation is improperly performed.

In addition, a leakage detection operation may be performed as another example of the real-time monitoring. When a leakage occurs in a manufacturing process device, interference of an unintentional external gas may occur in the manufacturing process device, or concentration change of an internal gas may occur in the manufacturing process device. Thus, it may be important for the leakage detection operation to be properly performed on the manufacturing process device in the manufacturing process.

An optical emission spectroscopy, which monitors emission intensity at a predetermined wavelength using an optical emission spectrometer (OES), may be used for the endpoint detection operation and/or the leakage detection operation. The optical emission spectroscopy is an optical emission analyzing method. Thus, the optical emission spectroscopy may obtain information related to atoms or ionic molecules within plasma using a non-invasive spectroscopic probe. Hence, the optical emission spectroscopy may be used to detect characteristics of the atoms or ionic molecules within the plasma. For example, the optical emission spectroscopy may detect a leakage of the manufacturing process device by determining whether or not the emission intensity due to nitrogen, oxygen, etc constituting the atmosphere in the manufacturing process device is out of a predetermined tolerance range. However, a light going through the optical emission spectrometer may decrease due to pollution of the manufacturing process device. In addition, a sensitivity difference may occur due to measurement locations of the optical emission spectrometer. As a result, leakage detection failure and wrong leakage detection may be caused when detecting the leakage of the manufacturing process device.

As described above, some example embodiments provide a method of monitoring a manufacturing process that may normally monitor a manufacturing process even when a sensitivity change is caused due to pollution and/or measurement locations. Some example embodiments provide a manufacturing process monitoring device that may normally monitor a manufacturing process even when a sensitivity change is caused due to pollution and/or measurement locations.

A method of monitoring a manufacturing process according to example embodiments may normally monitor a manufacturing process even when a sensitivity change is caused due to pollution and/or measurement locations. The method may include generating a measurement data corresponding to emission intensity of plasma emission light, by generating a compensated value based on the measurement data, the compensated value being generated by offsetting the sensitivity change, and by monitoring the manufacturing process based on the compensated value.

In addition, a manufacturing process monitoring device according to example embodiments may normally monitor a manufacturing process even when a sensitivity change is caused due to pollution and/or measurement locations. The device may include a measurement unit that generates a measurement data corresponding to emission intensity of plasma emission light and an output unit that generates a compensated value based on the measurement data, the compensated value being generated by offsetting the sensitivity change, and that monitoring the manufacturing process based on the compensated value.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of monitoring a manufacturing process, the method comprising:

generating a measurement data by analyzing emission intensity of plasma emission light using a measurement device, the plasma emission light being generated when a plasma gas of a manufacturing process device is changed from an energy level corresponding to a high energy state to an energy level corresponding to a low energy state;

generating a compensated value based on the measurement data, the compensated value being generated by offsetting a sensitivity change that is caused due to pollution of the manufacturing process device and the measurement device or measurement locations of the measurement device; and monitoring the manufacturing process based on the compensated value, wherein generating the compensated value includes determining the compensated value as a normalized value that is generated by normalizing the emission intensity of the plasma emission light based on an average and a standard deviation of the emission intensity of the plasma emission light in reference to a preset band or a whole band of wavelengths.

2. The method of claim 1, wherein monitoring the manufacturing process includes:

performing an endpoint detection operation based on the compensated value.

3. The method of claim 1, wherein monitoring the manufacturing process includes:
performing a leakage detection operation on the manufacturing process device based on the compensated value.

4. A method of monitoring a manufacturing process, the method comprising:
generating a plasma gas by injecting a gas of a manufacturing process device into a generating device that converts the gas into the plasma gas;
generating a measurement data by analyzing emission intensity of plasma emission light using a measurement device, the plasma emission light being generated when the plasma gas is changed from an energy level corresponding to a high energy state to an energy level corresponding to a low energy state;
generating a compensated value based on the measurement data, the compensated value being generated by offsetting a sensitivity change that is caused due to pollution of the manufacturing process device and the measurement device or measurement locations of the measurement device; and
monitoring the manufacturing process based on the compensated value, wherein
generating the compensated value includes determining the compensated value as a normalized value that is generated by normalizing the emission intensity of the plasma emission light based on an average and a standard deviation of the emission intensity of the plasma emission light in reference to a preset band or a whole band of wavelengths.

5. The method of claim 4, wherein monitoring the manufacturing process includes:
performing an endpoint detection operation based on the compensated value.

6. The method of claim 4, wherein monitoring the manufacturing process includes:
performing a leakage detection operation on the manufacturing process device based on the compensated value.

7. A manufacturing process monitoring device, comprising:
a measurement unit to generate a measurement data by analyzing emission intensity of plasma emission light, the plasma emission light being generated when a plasma gas of a manufacturing process device is changed from an energy level corresponding to a high energy state to an energy level corresponding to a low energy state; and
a control unit to generate a compensated value based on the measurement data, the compensated value being generated by offsetting a sensitivity change that is caused due to pollution of the manufacturing process device and the measurement unit or measurement locations of the measurement unit, and to monitor the manufacturing process based on the compensated value, wherein
the control unit determines the compensated value as a normalized value that is generated by normalizing the emission intensity of the plasma emission light based on an average and a standard deviation of the emission intensity of the plasma emission light in reference to a preset band or a whole band of wavelengths.

8. The device of claim 7, further comprising:
an output unit to display a monitoring result output from the control unit.

9. A manufacturing process monitoring device, comprising:
a generating unit to receive a gas of a manufacturing process device, and to generate a plasma gas based on the gas of the manufacturing process device;
a measurement unit to generate a measurement data by analyzing emission intensity of plasma emission light, the plasma emission light being generated when the plasma gas of the generating unit is changed from an energy level corresponding to a high energy state to an energy level corresponding to a low energy state; and
a control unit to generate a compensated value based on the measurement data, the compensated value being generated by offsetting a sensitivity change that is caused due to pollution of the manufacturing process device and the measurement unit or measurement locations of the measurement unit, and to monitor the manufacturing process based on the compensated value, wherein
the control unit determines the compensated value as a normalized value that is generated by normalizing the emission intensity of the plasma emission light based on an average and a standard deviation of the emission intensity of the plasma emission light in reference to a preset band or a whole band of wavelengths.

10. The device of claim 9, further comprising:
an output unit to display a monitoring result output from the control unit.

* * * * *